United States Patent
Maebashi et al.

(10) Patent No.: US 9,496,693 B2
(45) Date of Patent: Nov. 15, 2016

(54) ELECTRONIC COMPONENT UNIT AND WIRE HARNESS

(71) Applicant: YAZAKI CORPORATION, Tokyo (JP)

(72) Inventors: Akemi Maebashi, Shizuoka (JP); Pharima Akanitsuk, Shizuoka (JP); Hiroki Shiraiwa, Shizuoka (JP); Yasuhiro Tokumasu, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/692,127

(22) Filed: Apr. 21, 2015

(65) Prior Publication Data

US 2015/0303669 A1    Oct. 22, 2015

(30) Foreign Application Priority Data

Apr. 21, 2014 (JP) .................................. 2014-087543
Feb. 12, 2015 (JP) .................................. 2015-025698

(51) Int. Cl.
| | | |
|---|---|---|
| H05K 5/00 | (2006.01) | |
| H01B 7/00 | (2006.01) | |
| H02G 3/08 | (2006.01) | |
| B60R 16/023 | (2006.01) | |
| H01B 17/14 | (2006.01) | |
| H05K 7/02 | (2006.01) | |

(52) U.S. Cl.
CPC .......... *H02G 3/081* (2013.01); *B60R 16/0238* (2013.01); *B60R 16/0239* (2013.01); *H05K 5/0052* (2013.01); *H01B 17/14* (2013.01); *H05K 7/026* (2013.01)

(58) Field of Classification Search
CPC .......... H02G 5/00; H02G 5/06; H02G 5/066; H02G 5/068; H02G 3/08; H02G 3/081; H02G 3/14; H01B 7/0045; B60R 16/0238; B60R 16/0239; H02B 1/20
USPC .......... 174/50, 68.2, 72 B, 72 A, 71 B, 88 B, 174/99 B, 129 B, 133 B, 520, 535, 549, 559, 174/560–563; 361/648, 624, 637, 639
See application file for complete search history.

(56) References Cited

U.S. PATENT DOCUMENTS 7,699,623 B2 * 4/2010 Yoshida ................. H02G 3/081
174/50
2013/0250489 A1    9/2013 Toda et al.

FOREIGN PATENT DOCUMENTS

JP    2013-198347 A    9/2013

* cited by examiner

*Primary Examiner* — Dimary Lopez Cruz
(74) *Attorney, Agent, or Firm* — Sughrue Mion, PLLC

(57) ABSTRACT

An electronic component unit includes a plate made of a resin material configured to embed metallic bus bars in the resin material and mount electronic components thereon, and a supporting member to which the plate is assembled. The plate has a plurality of exposed ends at which the bus bars are partially exposed on edge surfaces of the plate. The supporting member includes protrusions that are formed on opposed surfaces facing the edge surfaces of the plate such that the protrusions face the edge surfaces of the plate, protrude from the opposed surfaces toward the edge surface sides of the plate, and are each located between the adjacent exposed ends in an arrangement direction of the multiple exposed ends.

20 Claims, 10 Drawing Sheets

ELECTRONIC COMPONENT UNIT AND WIRE HARNESS

CROSS-REFERENCE TO RELATED APPLICATIONS

The present application claims priority to and incorporates by reference the entire contents of Japanese Patent Application No. 2014-087543 filed in Japan on Apr. 21, 2014 and Japanese Patent Application No. 2015-025698 filed in Japan on Feb. 12, 2015.

BACKGROUND OF THE INVENTION

1. Field of the Invention

The present invention relates to an electronic component unit and a wire harness.

2. Description of the Related Art

An example of conventional electronic component units provided to conventional wire harnesses mounted on vehicles is disclosed in Japanese Patent Application Laid-open No. 2013-198347 as an electronic component module. The electronic component module includes an electronic component substrate having an insulating plate to which a plurality of bus bars are attached, each of the bus bars having an external terminal connecting part and being electrically connected to an electronic component, a case housing the electronic component substrate therein, and a connector-connecting part in which a plurality of external terminal connecting parts of the plurality of bus bars are collected. The electronic component module includes the connector-connecting part disposed between the multiple electronic components, thereby downsizing the module serving as the electronic component unit.

In the electronic component unit disclosed in Japanese Patent Application Laid-open No. 2013-198347, the ends of the bus bars are exposed on the edge surfaces of the electronic component substrate in some cases. Even in such cases, it is desired that the electronic component substrate (plate) and the case (housing) serving as a supporting member are properly assembled to each other by preventing the case from being scratched by the exposed ends of the bus bars.

SUMMARY OF THE INVENTION

In view of the foregoing, the present invention has been made, and an object thereof is to provide an electronic component unit and a wire harness that can enhance an assembling property of the plate to the supporting member.

According to one aspect of the present invention, an electronic component unit includes a plate made of a resin material configured to embed a metallic bus bar in the resin material and mount an electronic component thereon; and a supporting member to which the plate is assembled, wherein the plate has a plurality of exposed ends at which the bus bar is partially exposed on an edge surface of the plate, and the supporting member includes a protrusion that is formed on an opposed surface facing the edge surface of the plate such that the protrusion faces the edge surface of the plate, protrudes from the opposed surface toward the edge surface side of the plate, and is located between the adjacent exposed ends in an arrangement direction of the multiple exposed ends.

According to another aspect of the present invention, it is possible to configure that the protrusion includes a protruded rib that is formed on the opposed surface such that the protruded rib faces the edge surface of the plate, protrudes from the opposed surface toward the edge surface side of the plate, and is located between the adjacent exposed ends in the arrangement direction of the multiple exposed ends, in a state where the plate is assembled to the supporting member.

According to still another aspect of the present invention, it is possible to configure that the protrusion includes a projecting wall portion that is formed such that a wall body including the opposed surface is depressed toward the edge surface side of the plate, faces the edge surface of the plate, and is located between the adjacent exposed ends in the arrangement direction of the multiple exposed ends, in a state where the plate is assembled to the supporting member.

According to still another aspect of the present invention, it is possible to configure that the supporting member includes a base to which the plate is assembled and a lid that covers the plate assembled to the base from the side opposite the base, and the plate is assembled to an inside of the supporting member, the inside being defined by the base and the lid, and the protrusion extends along a direction in which the base, the plate, and the lid are stacked.

According to still another aspect of the present invention, it is possible to configure that the opposed surface is an inner wall surface of the lid, and the base includes a fitting recessed portion to which the protrusion is capable of being fitted.

According to still another aspect of the present invention, it is possible to configure that a protruding amount of the protrusion from the opposed surface toward the edge surface side of the plate is larger than a clearance between the exposed ends and the opposed surface.

According to still another aspect of the present invention, it is possible to configure that the plate has the plurality of exposed ends on each of paired opposite edge surfaces, and at least one protrusion is disposed on each of the opposed surfaces facing the corresponding paired opposite edge surfaces.

According to still another aspect of the present invention, it is possible to configure that the supporting member includes a base to which the plate is assembled and a lid that covers the plate assembled to the base from the side opposite the base, and the plate is assembled to an inside of the supporting member, the inside being defined by the base and the lid, the opposed surface is an inner wall surface of the lid, and the plate includes a guide portion that is formed on a surface facing the lid, and guides a top end of the protrusion outside the edge surface of the plate, in a state where the plate is assembled to the inside of the supporting member.

According to still another aspect of the present invention, it is possible to configure that the guide portion has a tapered surface that is tilted toward outside of the edge surface of the plate.

According to still another aspect of the present invention, a wire harness includes an electric wire; and an electronic component unit electrically connected to the electric wire, wherein the electronic component unit includes a plate made of a resin material configured to embed a metallic bus bar in the resin material and mount an electronic component thereon, and a supporting member to which the plate is assembled, the plate has a plurality of exposed ends at which the bus bar is partially exposed on an edge surface of the plate, and the supporting member includes a protrusion that is formed on an opposed surface facing the edge surface of the plate such that the protrusion faces the edge surface of the plate, protrudes from the opposed surface toward the edge surface side of the plate, and is located between the adjacent exposed ends in an arrangement direction of the multiple exposed ends.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

The following describes embodiments according to the present invention in detail with reference to the accompanying drawings. The embodiments do not limit the invention. The constituent elements of the following embodiments include elements that can be easily replaced by persons skilled in the art or that are substantially the same as the elements known by those in the art.

First Embodiment

Figure 1:
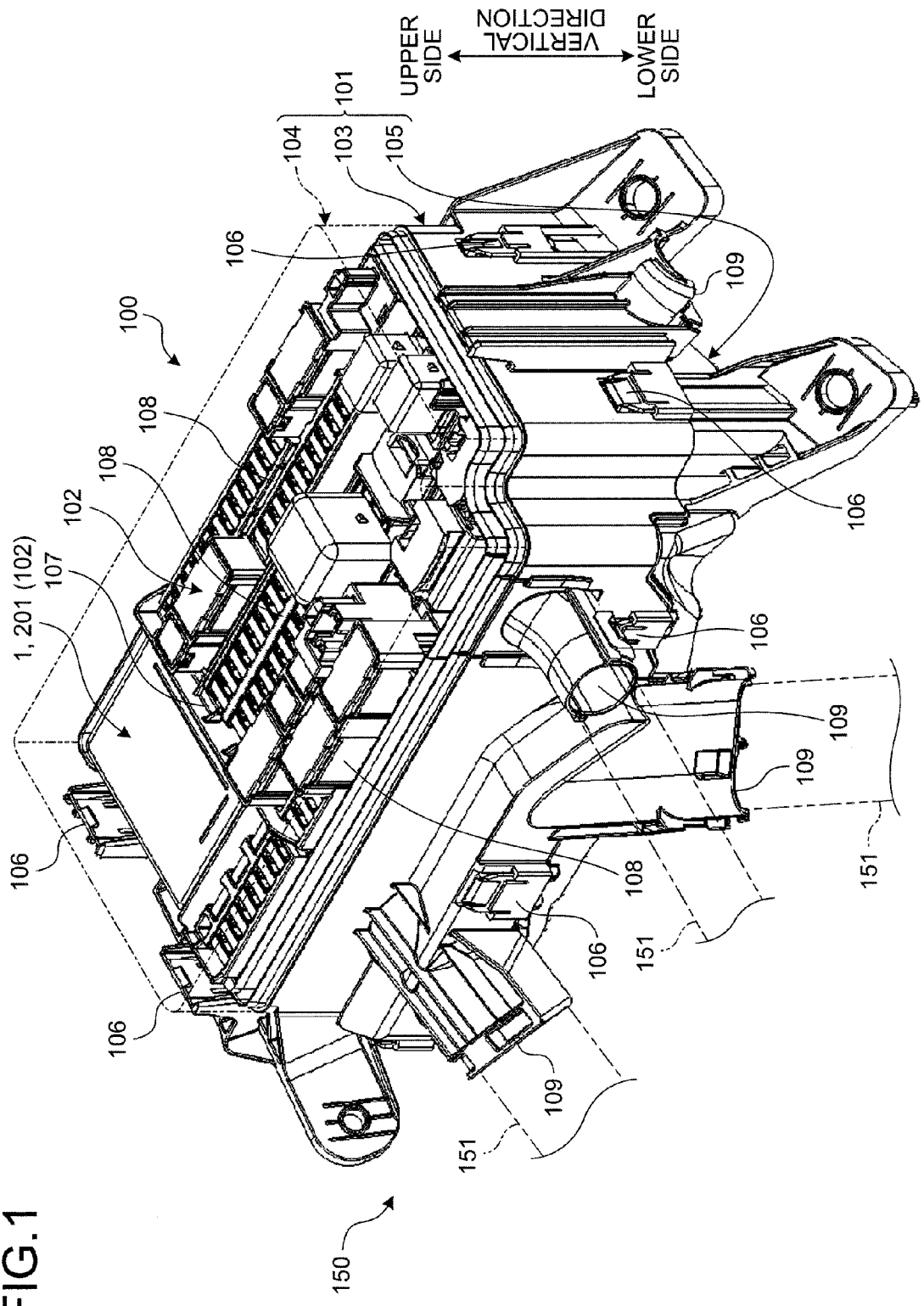
FIG. 1 is a perspective view illustrating a schematic structure of an electrical connection box to which an electronic component unit according to a first embodiment is applied.
Figure 2:
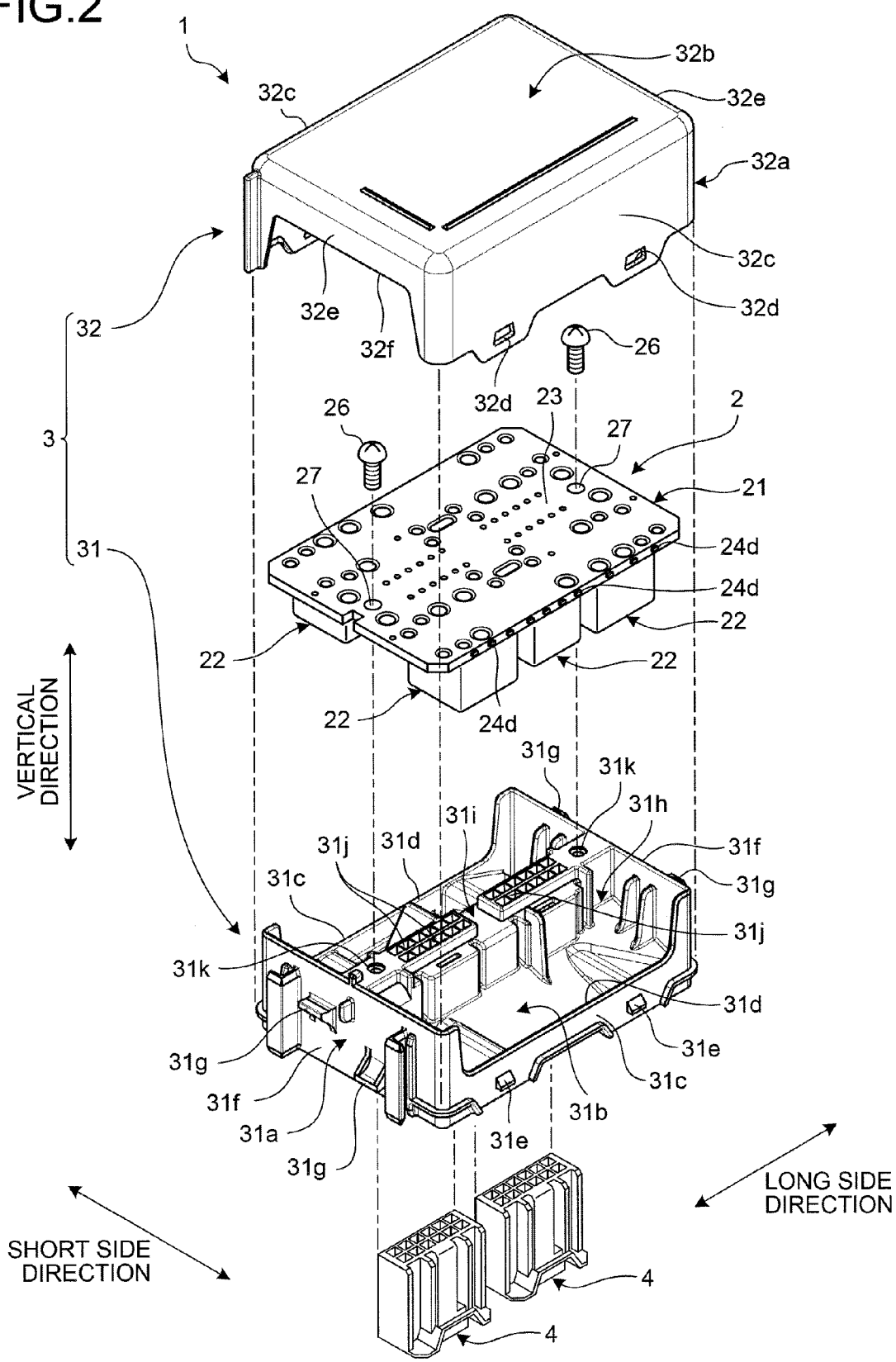
FIG. 2 is an exploded perspective view illustrating a schematic structure of the electronic component unit according to the first embodiment.
Figure 3:
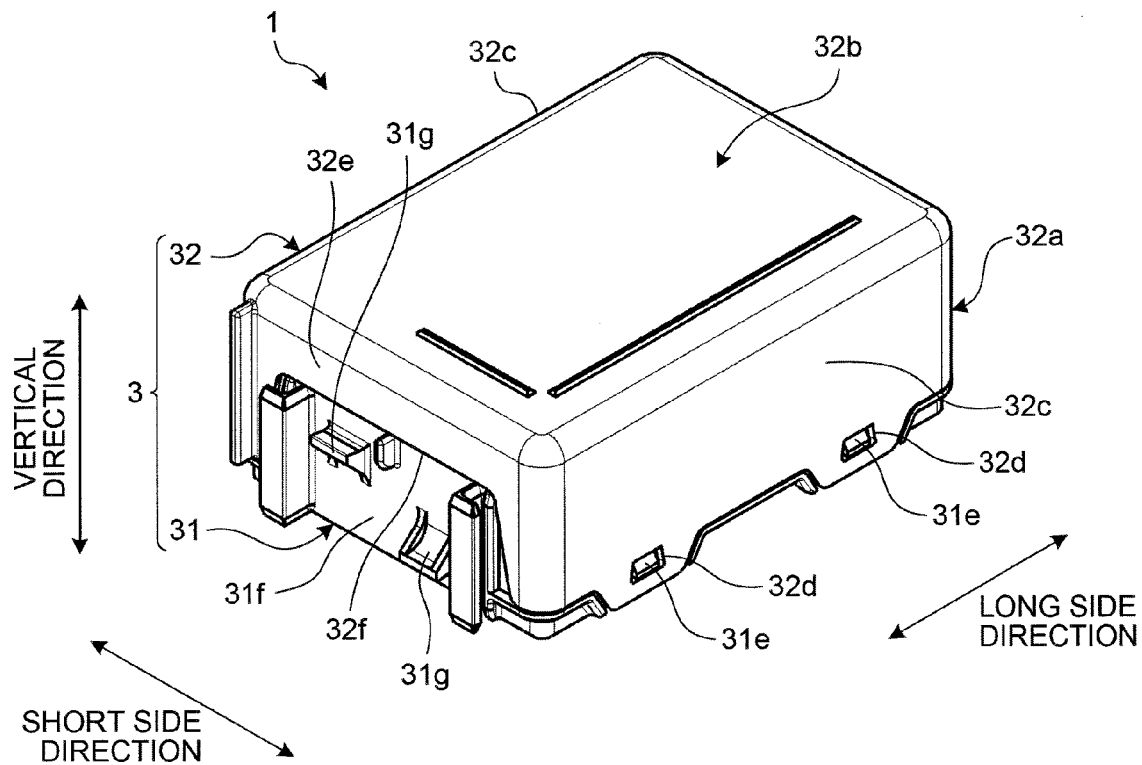
FIG. 3 is a perspective view illustrating the schematic structure of the electronic component unit according to the first embodiment.
Figure 4:
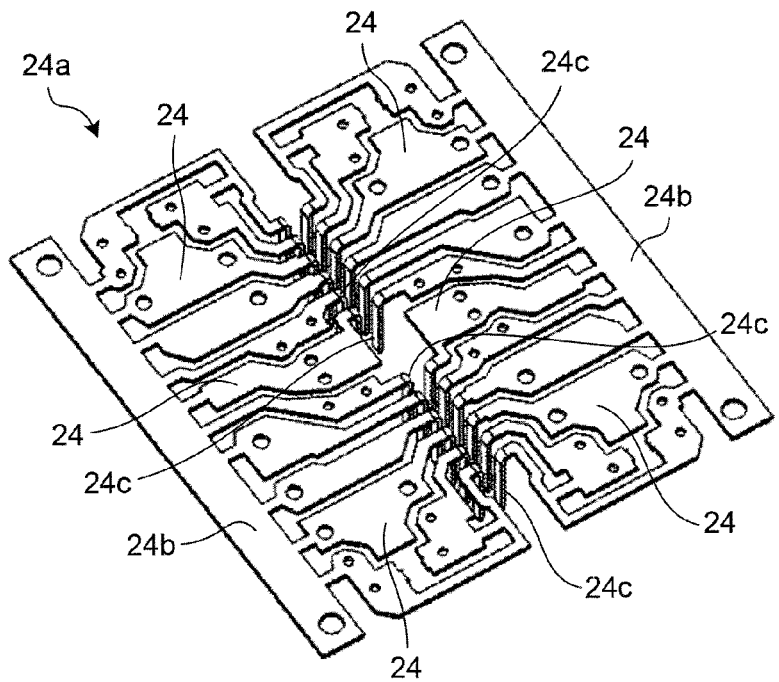
FIG. 4 is a perspective view explaining bus bars of the electronic component unit according to the first embodiment.
Figure 5:
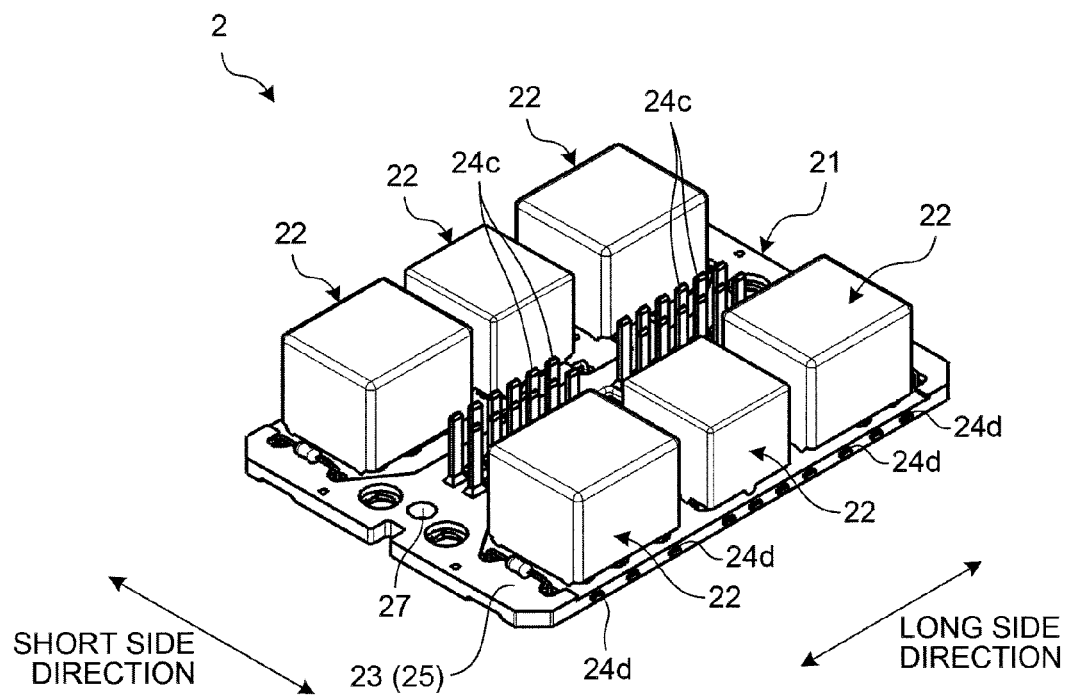
FIG. 5 is a perspective view illustrating a schematic structure of an insert bus bar plate of the electronic component unit according to the first embodiment.
Figure 6:
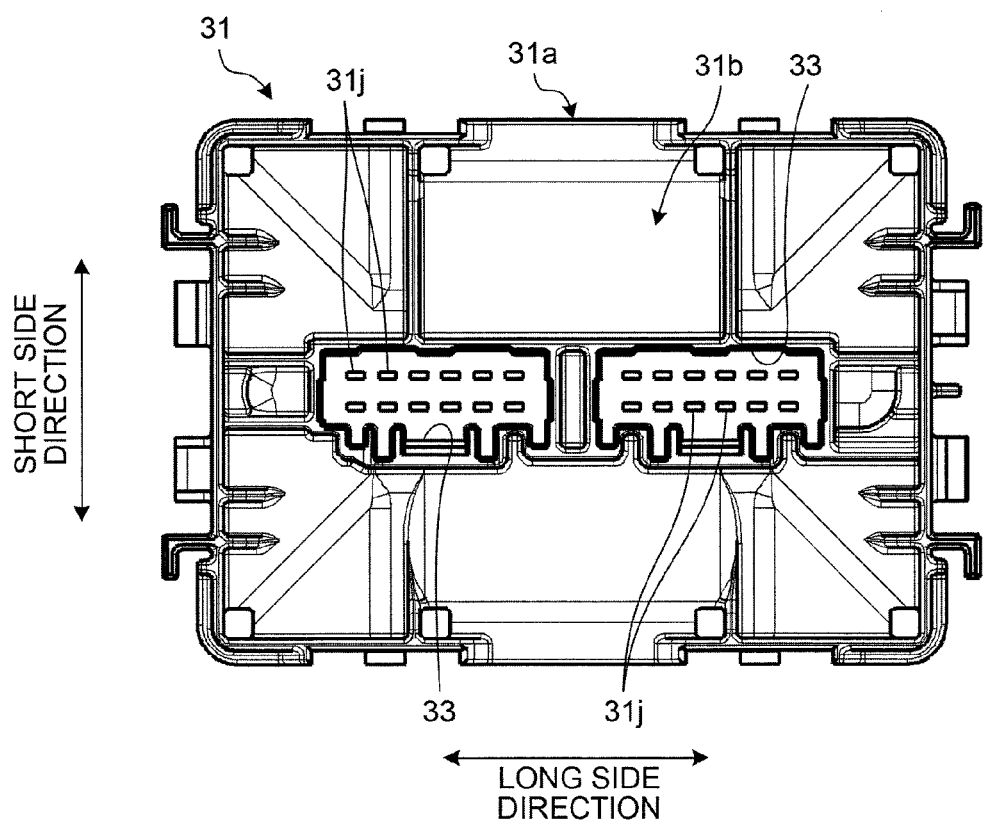
FIG. 6 is a plan view of a base cover of the electronic component unit according to the first embodiment viewed from a connector fitting part side.
Figure 7:
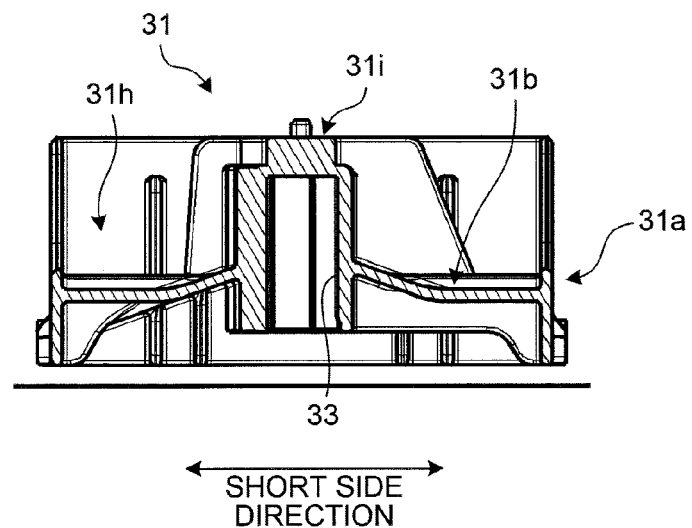
FIG. 7 is a cross-sectional view including a connector fitting part of the base cover of the electronic component unit according to the first embodiment.
Figure 8:
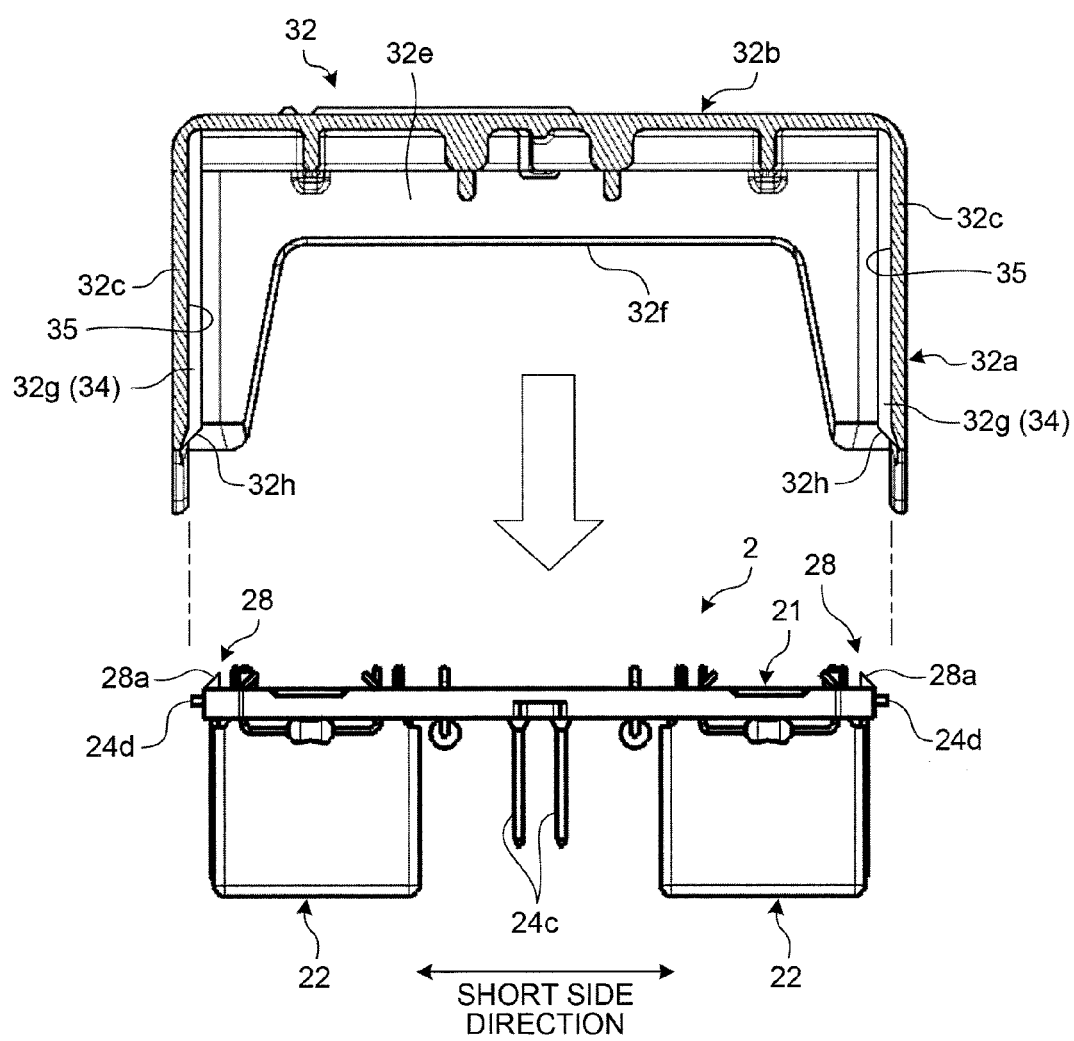
FIG. 8 is a schematic cross-sectional view including a top cover of the electronic component unit according to the first embodiment.
Figure 9:
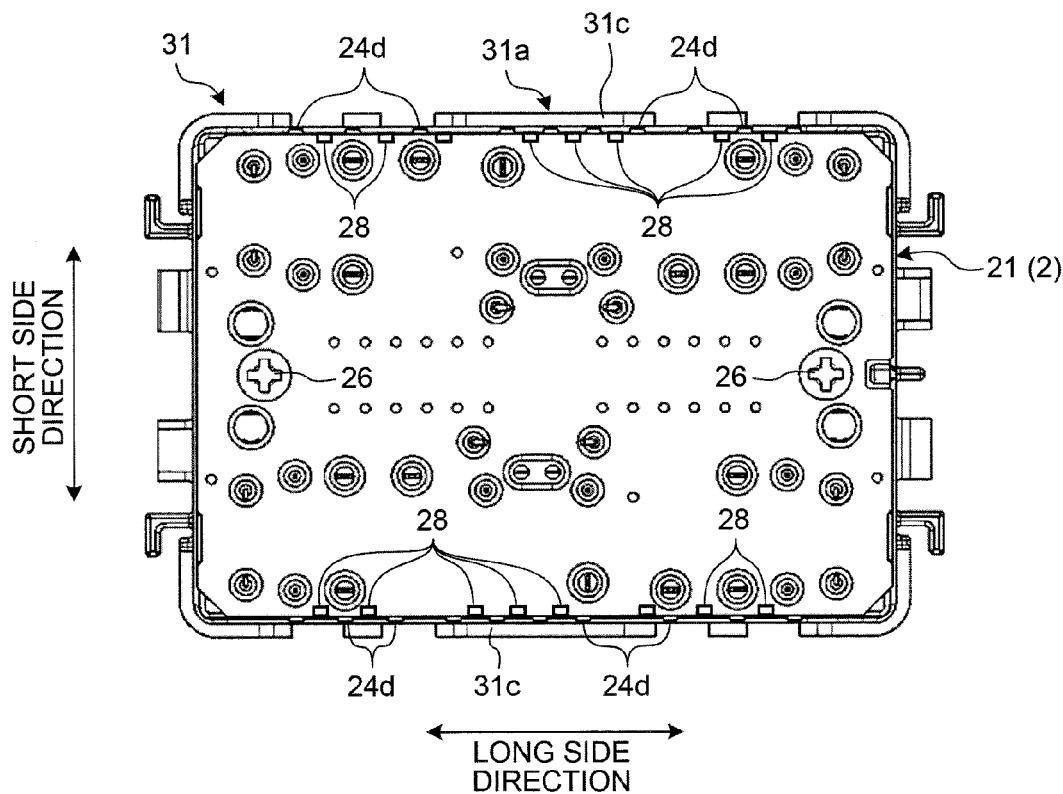
FIG. 9 is a plan view of the surface opposite a mounting surface of the insert bus bar plate assembled to the base cover of the electronic component unit according to the first embodiment.
Figure 10:
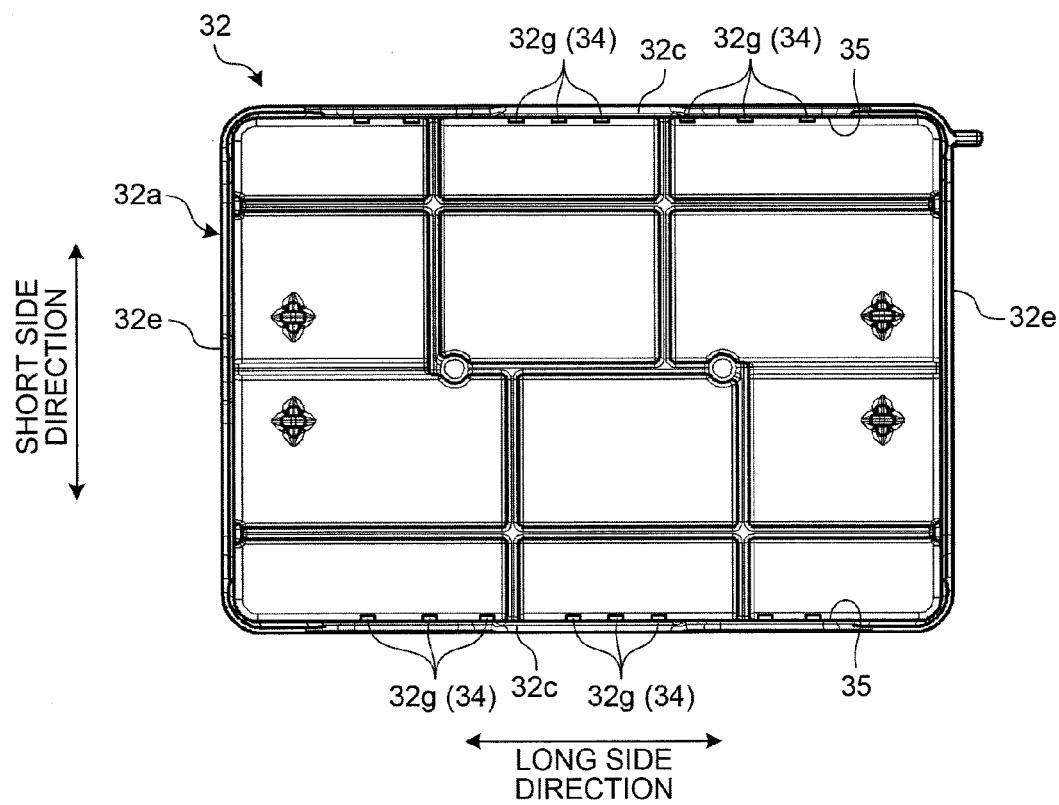
FIG. 10 is a plan view of the inside of a ceiling of the top cover of the electronic component unit according to the first embodiment.
Figure 11:
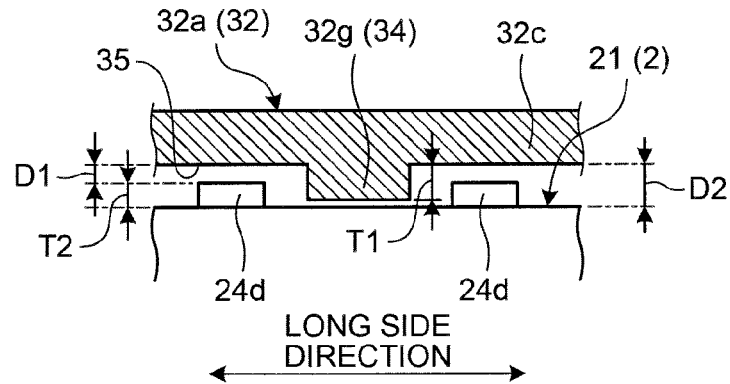
FIG. 11 is a schematic partial cross-sectional view including a protruded rib of the electronic component unit according to the first embodiment.
Figure 12:
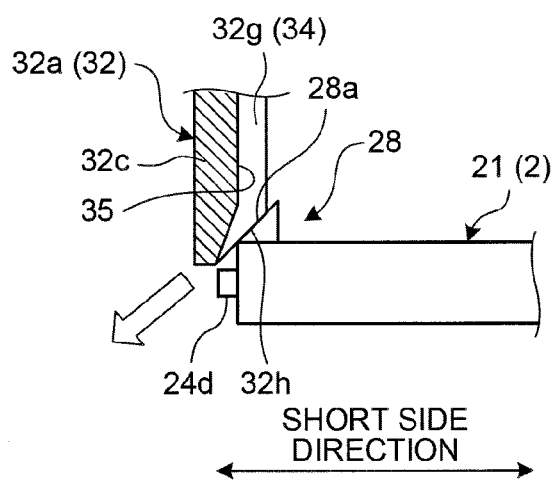
FIG. 12 is a schematic partial cross-sectional view of an area near an exposed end of the electronic component unit according to the first embodiment.
Figure 13:
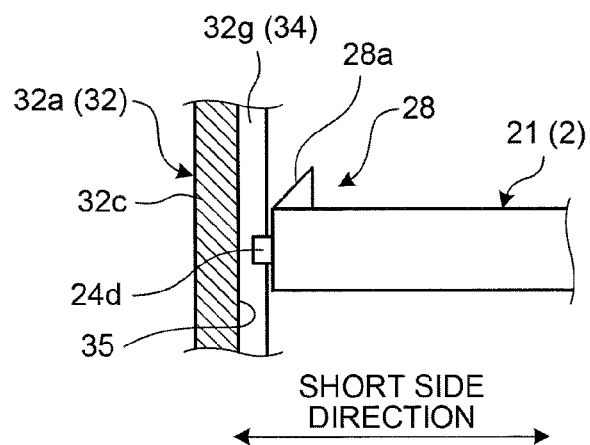
FIG. 13 is a schematic partial cross-sectional view of an area near the exposed end of the electronic component unit according to the first embodiment.

FIG. 1 is a perspective view illustrating a schematic structure of an electrical connection box to which an electronic component unit according to a first embodiment is applied. FIG. 2 is an exploded perspective view illustrating a schematic structure of the electronic component unit according to the first embodiment. FIG. 3 is a perspective view illustrating the schematic structure of the electronic component unit according to the first embodiment. FIG. 4 is a perspective view explaining bus bars of the electronic component unit according to the first embodiment. FIG. 5 is a perspective view illustrating a schematic structure of an insert bus bar plate of the electronic component unit according to the first embodiment. FIG. 6 is a plan view of a base cover of the electronic component unit according to the first embodiment viewed from a connector fitting part side. FIG. 7 is a cross-sectional view including a connector fitting part of the base cover of the electronic component unit according to the first embodiment. FIG. 8 is a schematic cross-sectional view including a top cover of the electronic component unit according to the first embodiment. FIG. 9 is a plan view of the surface opposite a mounting surface of the insert bus bar plate assembled to the base cover of the electronic component unit according to the first embodiment. FIG. 10 is a plan view of the inside of a ceiling of the top cover of the electronic component unit according to the first embodiment. FIG. 11 is a schematic partial cross-sectional view including a protruded rib of the electronic component unit according to the first embodiment. FIGS. 12 and 13 are schematic partial cross-sectional views of an area near an exposed end of the electronic component unit according to the first embodiment. In FIG. 1, an upper cover of the electrical connection box is illustrated with the alternate long and two short dashes line.

As illustrated in FIG. 1, an electronic component unit 1 according to the first embodiment is structured as an electronic component module that is assembled to an electrical connection box 100 mounted on a vehicle such as an automobile in a detachable manner. The electrical connection box 100 is assembled to a wire harness 150 and collectively houses therein electrical equipments such as connectors included in connection processing components, such as electric wires, fuses, relays, branches, and an electronic control unit. The wire harness 150 includes electric wires 151 and the electrical connection box 100 (the electronic component unit 1) electrically connected to the electric wires 151. The electrical connection box 100 is provided in an engine room of a vehicle or a lower portion of a vehicle body, for example. The electrical connection box 100 is coupled between a power source such as a battery and various electronic devices mounted inside the vehicle. The electrical connection box 100 distributes electric power supplied from the power source to the various electronic devices inside the vehicle. The electrical connection box 100 is sometimes called a junction box, a fuse box, or a relay box, for example. In the embodiment, those boxes are collectively called the electrical connection box.

The electrical connection box 100 exemplarily illustrated in FIG. 1 houses various electronic components 102 in a housing space inside a box main body 101. The box main body 101 includes a body 103, an upper cover 104, and a lower cover 105, for example. The box main body 101 has a separated three-layer divided structure in which the body 103, the upper cover 104, and the lower cover 105 are stacked. The body 103, the upper cover 104, and the lower cover 105 are formed of an insulating synthetic resin. The body 103 forms most of the housing space to which the electronic components 102 are assembled. The body 103 is formed in an approximately square tube shape. When the electrical connection box 100 is connected to the engine room, for example, one opening of the body 103 is located on the upper side in the vertical direction while the other opening of the body 103 is located on the lower side in the vertical direction. The upper cover 104 is a lid-shaped member that closes the opening of the body 103 on the upper side in the vertical direction. The lower cover 105 is a dish-shaped (tray-shaped) member that closes the opening of the body 103 on the lower side in the vertical direction. The box main body 101 is structured as follows. The upper cover 104 is assembled to the body 103 on the upper side of the body 103 in vertical direction such that the opening on the upper side in the vertical direction of the body 103 and the opening of the upper cover 104 face each other. The lower cover 105 is assembled to the body 103 on the lower side of the body 103 in the vertical direction such that the opening on the lower side in the vertical direction of the body 103 and the opening of the lower cover 105 face each other. In the box main body 101, the upper cover 104 and the lower cover 105 are engaged with the body 103 by various types of engagement mechanisms 106. The direction along which the body 103, the upper cover 104, and the lower cover 105 are stacked is typically along the vertical direction when the electrical connection box 100 is connected to the engine room, for example. The direction along which they are stacked is, however, tilted at a certain angle with respect to the vertical direction depending on the installation circumstances of the electrical connection box 100 in some cases.

The various electronic components 102 assembled to the housing space inside the box main body 101 include the electronic component unit 1 of the embodiment besides the connectors, the fuses, the relays, the branches, and the electronic control unit, which are described above. The electrical connection box 100 includes many cavities formed by partition walls 107 that have various shapes and are integrally formed with the body 103 and blocks 108 that have various shapes and are assembled to the body 103 in a detachable manner. The various electronic components 102 are assembled to the cavities. The partition walls 107 and the blocks 108 are also formed of the same insulating synthetic resin as the body 103 or another insulating synthetic resin, for example. The electrical connection box 100 is provided with openings 109, through which electric wires are routed. The terminals of the electric wires 151 are fitted, from below in the vertical direction, to the cavities to which the various electronic components 102 are assembled, thereby establishing electrical connections.

As illustrated in FIGS. 2 to 7, the electronic component unit 1 in the first embodiment includes an insert bus bar plate 2 serving as a plate, a housing 3 serving as a supporting member, connectors 4 serving as connecting parts of the electric wires 151. The insert bus bar plate 2 is assembled inside the housing 3.

As illustrated in FIGS. 2, 4, and 5, the insert bus bar plate 2 is a substrate that includes bus bars 24 made of a metal embedded in a resin material 23, and on which electronic components 22 are mounted. The insert bus bar plate 2 includes a substrate main body 21 and the electronic components 22.

The substrate main body 21 includes the multiple conductive bus bars 24 inside a resin material 23. In other words, the bus bars 24 are covered with the insulating resin material 23 and insulated from one another. The substrate main body 21 is formed by insert molding, for example. In the insert molding, the bus bars 24 formed of a conductive metal are arranged in a mold and an insulating resin is injected around the bus bars 24, thereby integrating the metal and the resin.

As exemplarily illustrated in FIG. 4, a bus bar assembly before molding 24a is the assembly of the bus bars 24 before insert molding. In the assembly, the multiple bus bars 24 are connected through carriers 24b. The bus bar assembly before molding 24a is formed of a conductive metal and processed by stamping, for example, into an approximately platy shape as a whole. The bus bar assembly before molding 24a is inserted into a mold for insert molding while terminals 24c of the respective bus bars 24 are bent. The substrate main body 21 is formed by injecting an insulating resin around the bus bar assembly before molding 24a inserted in the mold to integrate the respective bus bars 24 and the resin material 23. The carriers 24b are cut off from the substrate main body 21 after the respective bus bars 24 and the resin material 23 are integrally formed. As a result, the substrate main body 21 is formed in a rectangular plate shape as a whole.

As illustrated in FIG. 5, for example, the terminals 24c of the respective bus bars 24 are arranged almost at the center in a short side direction (a first width direction) and side by side along a long side direction (a second width direction orthogonal to the first width direction) on the substrate main body 21 after being formed by the insert molding. The terminals 24c are arranged side by side in two rows along the long side direction. The respective terminals 24c are erected approximately perpendicular to a mounting surface 25 on which the electronic components 22 are mounted of the substrate main body 21. The respective terminals 24c protrude from the mounting surface 25 and extend along the direction orthogonal to the short side and the long side directions. The respective terminals 24c are disposed between the multiple electronic components 22, which are described later, in the short side direction. In other words, the multiple terminals 24c are collectively disposed at the central area of the mounting surface 25. In the respective edge faces on both sides of the substrate main body 21, the ends of the respective bus bars 24, which are connected to the carrier 24b and cut off from the carrier 24b after the insert molding, are exposed as exposed ends 24d from the resin material 23. The insert bus bar plate 2 has the multiple exposed ends 24d, which are the ends of the respective bus bars 24, on its edge surfaces. The exposed ends 24d are formed on the paired edge surfaces of the opposite long sides of the substrate main body 21. The multiple exposed ends 24d are exposed side by side in the long side direction on the edge surfaces of the respective long sides.

The electronic components 22, which are mounted on the mounting surface 25 of the substrate main body 21, are elements that perform various functions. The respective terminals of the electronic component 22 are electrically connected to the corresponding bus bars 24 and fixed on the bottom surface of the mounting surface 25 by soldering, for example. The electronic components 22 in the embodiment are relays, for example. The electronic component unit 1 in the embodiment is, thus, a relay unit module. The insert bus bar plate 2 in the embodiment is provided with six relays serving as the electronic components 22 in total. Specifically, three relays are disposed side by side along the long side direction on each of both sides of the terminals 24c in the short side direction. In other words, the electronic components 22 are arranged in two rows and the multiple terminals 24c are arranged in two rows between the electronic components 22 arranged in the two rows, on the insert bus bar plate 2. The insert bus bar plate 2 in the embodiment basically has a shape that is substantially line-symmetrically with respect to the center line along the long side direction (i.e., the center line in the short side direction) of the substrate main body 21. The terminals 24c and the electronic components 22 are also arranged in substantially line-symmetrically. On the insert bus bar plate 2, other elements such as relay resistors are mounted besides the six relays serving as the electronic components 22.

As illustrated in FIGS. 2, 3, 6, and 7, the insert bus bar plate 2 is assembled to the housing 3 and the housing 3 supports the insert bus bar plate 2. The housing 3 in the first embodiment includes a base cover 31 serving as a base, a top cover 32 serving as a lid, connector fitting parts 33 serving as a connecting portion-fitting part. The insert bus bar plate 2 is assembled to an inside defined by the base cover 31 and the top cover 32 of the housing 3. To the base cover 31, the insert bus bar plate 2 is assembled. The top cover 32 covers the insert bus bar plate 2 assembled to the base cover 31 from the side opposite the base cover 31. To each of the connector fitting parts 33, the connector 4 is fitted that serves as a portion connecting the terminals 24c of the bus bars 24 and electric wires. The connector fitting parts 33 are integrally formed with the base cover 31. The base cover 31, the top cover 32, and the connector fitting parts 33 are formed of an insulating synthetic resin.

As illustrated in FIG. 2, the base cover 31 is specifically a dish-shaped (tray-shaped) member. The base cover 31 includes a rectangular frame part 31a that serves as a wall body and is formed in an approximately square shape, and a bottom 31b that closes the rectangular frame part 31a. The bottom 31b is formed in a rectangular plate shape similar to the shape of the substrate main body 21 of the insert bus bar plate 2. The rectangular frame part 31a is formed such that it surrounds the outer edge of the bottom 31b. The bottom 31b is formed in a halfway portion of the rectangular frame part 31a by being integrated with the rectangular frame part 31a (e.g., refer to FIG. 7). In the rectangular frame part 31a, a notch 31d and engagement claws 31e for engaging with the top cover 32 are formed on each of a pair of long side sidewalls 31c along the long side direction of the bottom 31b. In the rectangular frame part 31a, engagement claws 31g for engaging with the box main body 101 of the electrical connection box 100 are formed on each of a pair of short side sidewalls 31f along the short side direction of the bottom 31b. The base cover 31 is formed in a rectangular tube shape (the notches 31d are partially formed) by the rectangular frame part 31a and the bottom 31b that is disposed in a halfway portion of the rectangular frame part 31a as the closing portion of the tube shape. The space surrounded by the rectangular frame part 31a and the bottom 31b of the base cover 31 is defined as a housing space 31h in which the electronic components 22 of the insert bus bar plate 2 are housed.

The base cover 31 has a central wall-shaped part 31i formed at the central area of the bottom 31b. The central wall-shaped part 31i is formed such that the bottom 31b protrudes on the housing space 31h side. The central wall-shaped part 31i is formed along the long side direction and at almost the center of the bottom 31b in the short side direction. The central wall-shaped part 31i extends from one short side sidewall 31f to the other short side sidewall 31f along the long side direction. In the central wall-shaped part 31i, a plurality of terminal fitting holes 31j and a pair of screw holes 31k are formed on the distal end surface thereof. The terminal fitting holes 31j, to which the terminals 24c of the respective bus bars 24 are fitted when the insert bus bar plate 2 is assembled to the base cover 31, are formed in accordance with the numbers and the arrangement positions of the terminals 24c. The terminal fitting holes 31j are arranged side by side in two rows along the long side direction. Into the screw holes 31k, screws 26 are screwed that fasten the insert bus bar plate 2 to the base cover 31 to assemble the insert bus bar plate 2 to the base cover 31.

As illustrated in FIGS. 6 and 7, the base cover 31 has cavities on the rear surface side of the central wall-shaped part 31i, i.e., on the side opposite the housing space 31h. The cavities serve as the connector fitting parts 33 to each of which the connector 4 serving as the connecting part of the electric wires is fitted. The terminals 24c of the respective bus bar 24 are exposed in the connector fitting parts 33 after passing through the corresponding terminal fitting holes 31j in a state where the insert bus bar plate 2 is assembled to the base cover 31. The connector fitting part 33 is formed at each of two places. The connector 4 is fitted to each of the two connector fitting parts 33, i.e., the two connectors 4 are fitted in total. In the electronic component unit 1 in the embodiment, the two connectors 4 are connected to the terminals 24c of the multiple bus bars 24.

As illustrated in FIG. 2, the top cover 32 is a lid-shaped member. The top cover 32 includes a rectangular frame part 32a that serves as a wall body and is formed in an approximately square shape, and a ceiling 32b that closes one opening of the rectangular frame part 32a. The ceiling 32b is formed in a rectangular plate shape similar to the shapes of the substrate main body 21 of the insert bus bar plate 2 and the bottom 31b of the base cover 31. The rectangular frame part 32a is formed such that it is erected from the outer edge of the ceiling 32b. In the rectangular frame part 32a, engagement recesses 32d for engaging with the base cover 31 are formed on each of a pair of long side sidewalls 32c along the long side direction of the ceiling 32b. In the rectangular frame part 32a, a notch 32f is formed on each of a pair of short side sidewalls 32e along the short side direction of the ceiling 32b. The top cover 32 is formed by the rectangular frame part 32a and the ceiling 32b in a rectangular tube shape (the notches 32f are partially formed) having one open end and the other close end.

As illustrated in FIGS. 2 and 3, the insert bus bar plate 2 is assembled to the base cover 31, the side opposite the base cover 31 of the insert bus bar plate 2 is covered with the top cover 32, and the connectors 4 are fitted to the connector fitting parts 33. As a result, the electronic component unit 1 is structured as a module.

More specifically, in the electronic component unit 1, the insert bus bar plate 2 is assembled to the base cover 31 in such a positional relation that the electronic components 22 of the insert bus bar plate 2 are housed in the housing space 31h of the base cover 31, i.e., in such a positional relation that the mounting surface 25 (refer to FIG. 5 or the like) on which the electronic components 22 are mounted faces the bottom 31b of the base cover 31. When the insert bus bar plate 2 is assembled to the base cover 31 in the electronic component unit 1, the terminals 24c of the multiple bus bars 24 of the insert bus bar plate 2 are fitted to the corresponding terminal fitting holes 31j of the base cover 31, and the terminals 24c are exposed in the connector fitting parts 33 along the direction orthogonal to the short side and the long side directions. In the electronic component unit 1, the screws 26 are inserted into screw holes 27 of the insert bus bar plate 2 and then screwed into the screw holes 31k of the base cover 31, thereby fastening the insert bus bar plate 2 and the base cover 31. In the electronic component unit 1, three electronic components 22 are located on each of both sides of the central wall-shaped part 31i in the short side direction when the insert bus bar plate 2 is assembled to the base cover 31.

In the electronic component unit 1, the top cover 32 is attached to the base cover 31 and the like in such a positional relation that the top cover 32 covers the insert bus bar plate 2 assembled to the base cover 31 from the side opposite the base cover 31. In the electronic component unit 1, the respective engagement claws 31e of the base cover 31 are engaged with the corresponding engagement recesses 32d of the top cover 32 while the top cover 32 is attached to the appropriate position. As a result, the top cover 32 is assembled to the base cover 31. As illustrated in FIG. 3, for example, in the electronic component unit 1, the rectangular frame part 32a of the top cover 32 is disposed outside so as to overlap the rectangular frame part 31a of the base cover 31, and the engagement claws 31g are exposed from the notches 32f of the top cover 32 when the top cover 32 is assembled to the base cover 31. The connectors 4 are fitted to the connector fitting parts 33 along the direction orthogonal to the short side and the long side directions. As a result, the terminals 24c of the multiple bus bars 24 are connected to the connectors 4 and the electronic component unit 1 is assembled to a certain place inside the box main body 101 of the electrical connection box 100 with the respective engagement claws 31g.

The direction along which the base cover 31, the insert bus bar plate 2, and the top cover 32 are stacked is along the vertical direction when the electrical connection box 100 is connected to the engine room, for example, in the same manner as the electrical connection box 100 described above. The direction along which they are stacked may be, however, tilted at a certain angle with respect to the vertical direction depending on the installation circumstances of the electrical connection box 100 in some cases.

As illustrated in FIGS. 8 to 13, protrusions 34 are formed on the housing 3 serving as the supporting member in the electronic component unit 1 in the first embodiment, thereby enhancing an assembling property of the insert bus bar plate 2 to the housing 3. In the electronic component unit 1 in the first embodiment, protruded ribs 32g are formed on the top cover 32 as the protrusions 34.

Specifically, as illustrated in FIGS. 8 and 10, for example, the housing 3 including the base cover 31 and the top cover 32 further includes the protrusions 34. The protrusions 34 are formed on opposed surfaces 35 of the housing 3 (e.g., refer to FIGS. 11 and 13). In the housing 3, each of the opposed surfaces 35 is a wall surface facing the edge surface on which the exposed ends 24d of the insert bus bar plate 2 are formed. The protrusions 34 are formed on each of the opposed surfaces 35 such that the protrusions 34 face the edge surface of the insert bus bar plate 2, protrude from the opposed surface 35 toward the edge surface side of the insert bus bar plate 2, and are each located between the adjacent exposed ends 24d in the arrangement direction of the multiple exposed ends 24d. The opposed surfaces 35 in the first embodiment are inner wall surfaces of the top cover 32. More specifically, the opposed surfaces 35 are the inner wall surfaces of the long side sidewalls 32c serving as wall bodies. The protrusions 34 in the first embodiment include the protruded ribs 32g formed on the inner wall surfaces of the long side sidewalls 32c.

The protruded ribs 32g are formed on the inner wall surfaces of the top cover 32 constituting the opposed surfaces 35. The opposed surfaces 35, which are the inner wall surfaces on which the protruded ribs 32g are formed of the top cover 32, face the housing space 31h in a state where the top cover 32 is assembled to the base cover 31. The protruded ribs 32g are formed at the locations that face the edge surfaces of the insert bus bar plate 2, specifically the edge surfaces on which the exposed ends 24d are formed along the long side direction, in a state where the insert bus bar plate 2 is assembled inside the housing 3. The protruded ribs 32g are formed on the inner wall surfaces of the long side sidewalls 32c of the top cover 32. The protruded ribs 32g are each located between the adjacent exposed ends 24d in the arrangement direction of the multiple exposed ends 24d, and protrude from the inner wall surface of the long side sidewall 32c toward the edge surface of the insert bus bar plate 2. The arrangement direction of the multiple exposed ends 24d typically corresponds to the long side direction of the substrate main body 21. The protruded ribs 32g (the protrusions 34) extend along the direction in which the base cover 31, the insert bus bar plate 2, and the top cover 32 are stacked. The protruded ribs 32g are formed such that they extend from the ceiling 32b to the top ends of the long side sidewalls 32c along the inner wall surfaces of the long side sidewalls 32c of the top cover 32 in a direction toward the base cover 31 and the insert bus bar plate 2 when the top cover 32 is assembled to the base cover 31.

Here, the multiple exposed ends 24d are exposed on each of the edge surfaces of the paired long sides of the insert bus bar plate 2, which edge surfaces serve as the paired opposite edge surfaces. In contrast, at least one protruded rib 32g (protrusion 34) is disposed on each of the inner wall surfaces (the opposed surfaces 35) of the top cover 32. The respective inner wall surfaces face the corresponding paired opposite edge surfaces. In other words, at least one protruded rib 32g is disposed on each of the inner wall surfaces of the paired long side sidewalls 32c of the top cover 32. The protruded ribs 32g may be each formed between the adjacent exposed ends 24d of all of the exposed ends 24d. In the first embodiment, the protruded ribs 32g are each formed between the adjacent exposed ends 24d the distance between which is relatively small. In the example illustrated in FIG. 10, eight protruded ribs 32g are disposed on each of the long side sidewalls 32c, i.e., 16 protruded ribs 32g are disposed in total. The respective protruded ribs 32g are formed from an insulating synthetic resin by being integrated with the top cover 32.

As illustrated in FIG. 11, for example, a protruding amount T1 of each protruded rib 32g (protrusion 34) is larger than a clearance D1 between the exposed end 24d and the inner wall surface, which includes the opposed surface 35, of the long side sidewall 32c of the top cover 32 (T1>D1). The protruding amount T1 of the protruded rib 32g is the protruding amount of the protruded rib 32g from the inner wall surface of the long side sidewall 32c of the top cover 32 toward the edge surface side of the insert bus bar plate 2. The protruding amount T1 of each protruded rib 32g is smaller than a clearance (typically, a minimum clearance when tolerances are taken into account) D2 between the inner wall surface of the long side sidewall 32c of the top cover 32 and the edge surface on which the exposed ends 24d are formed of the insert bus bar plate 2, and larger than a protruding amount T2 of the exposed end 24d (T2<T1<D2). Here, the protruding amount T2 of the exposed end 24*d* is the protruding amount of the exposed end 24*d* from the edge surface of the insert bus bar plate 2 toward the inner wall surface side of the long side sidewall 32*c* of the top cover 32.

As illustrated in FIGS. 8, 9, 12, and 13, for example, the insert bus bar plate 2 in the first embodiment further includes guide portions 28. The guide portions 28 are formed on the surface opposite the surface facing the top cover 32 of the insert bus bar plate 2, i.e., the surface opposite the mounting surface 25 of the insert bus bar plate 2, in a state where the insert bus bar plate 2 is assembled inside the housing 3. The guide portions 28 abut the top ends (top ends along the stacking direction) of the protruded ribs 32*g* (the protrusions 34) and guide the top ends of the protruded ribs 32*g* to outside the edge surfaces of the insert bus bar plate 2 when the top cover 32 is attached. Here, the multiple guide portions 28 are disposed along the edge portions on the long side of the surface opposite the mounting surface 25 of the insert bus bar plate 2. The number of guide portions 28 corresponds to the number of protruded ribs 32*g*. Eight guide portions 28 are disposed on each long side, i.e., 16 guide portions 28 are disposed in total. The respective guide portions 28 are disposed at positions where they can abut on the corresponding protruded ribs 32*g*. Each guide portion 28 is formed by protruding from the surface opposite the mounting surface 25 of the insert bus bar plate 2, and has a tapered surface 28*a* that is tilted toward the outside the edge surface of the insert bus bar plate 2 as a guide surface that guides the top end of the protruded rib 32*g*. As a result, each guide portion 28 has a tapered shape. The respective guide portions 28 are formed of the resin material 23 constituting the insert bus bar plate 2 by being integrated with the insert bus bar plate 2. Specifically, the respective guide portions 28 are formed by being integrated with the insert bus bar plate 2 when the substrate main body 21 of the insert bus bar plate 2 is formed by insert molding. In the electronic component unit 1 in the first embodiment, the protruded ribs 32*g* each have a tapered surface 32*h* on the top end side thereof. When the tapered surface 32*h* of the protruded rib 32*g* is in contact with the tapered surface 28*a* of the guide portion 28, while facing each other. The tapered surface 32*h* is tilted toward outside the edge surface of the insert bus bar plate 2. As a result, each protruded rib 32*g* has a tapered shape.

The electronic component unit 1 described above includes the insert bus bar plate 2 that is made of the resin material 23 embedding therein the metallic bus bars 24 and on which the electronic components 22 are mounted, and the housing 3 to which the insert bus bar plate 2 is assembled. The insert bus bar plate 2 has the multiple exposed ends 24*d*, at which the bus bars 24 are partially exposed, on the edge surfaces thereof. The housing 3 has the protrusions 34. The protrusions 34 are formed on each opposed surface 35, which faces the edge surface of the insert bus bar plate 2, such that the protrusions 34 face the edge surface of the insert bus bar plate 2, protrude from the opposed surface 35 toward the edge surface side of the insert bus bar plate 2, and are each located between the adjacent exposed ends 24*d* in the arrangement direction of the multiple exposed ends 24*d*. The wire harness 150 described above includes the electric wires 151 and the electronic component unit 1 electrically connected to the electric wires 151.

As illustrated in FIG. 11, for example, the wire harness 150 including the electronic component unit 1 has, thus, such a structure that the protrusions 34 formed on the housing 3 to which the insert bus bar plate 2 is assembled are each located between the adjacent exposed ends 24*d* in the arrangement direction of the multiple exposed ends 24*d* of the bus bars 24. As a result, in the electronic component unit 1, the protrusions 34 each interposed between the adjacent exposed ends 24*d* can prevent the exposed ends 24*d* from coming into contact with the housing 3 when the insert bus bar plate 2 is assembled to the housing 3, for example. In the electronic component unit 1, when the exposed ends 24*d* almost come into contact with the opposed surfaces 35 of the housing 3 during the assembling of the insert bus bar plate 2 to the housing 3, the protrusions 34 abut the edge surfaces of the insert bus bar plate 2 before the exposed ends 24*d* come into contact with the opposed surfaces 35. In this way, in the electronic component unit 1, the protrusions 34 interposed between the edge surfaces of the insert bus bar plate 2 and the opposed surfaces 35 of the housing 3 can prevent the exposed ends 24*d* from coming into contact with the opposed surfaces 35 of the housing 3. As a result, the electronic component unit 1 can prevent the interference between the exposed ends 24*d* and the opposed surfaces 35 of the housing 3. The electronic component unit 1 can prevent the exposed ends 24*d* from scratching the housing 3 when the insert bus bar plate 2 is assembled to the housing 3, for example, thereby making it possible to enhance the workability of the assembly. As a result, the assembling property of the insert bus bar plate 2 to the housing 3 can be enhanced. In the electronic component unit 1, the protrusions 34 formed on the opposed surfaces 35 of the housing 3 can increase the stiffness of the long side sidewalls 32*c* of the housing 3, thereby making it possible to prevent the long side sidewalls 32*c* from being tilted (inward tilt) and the deterioration of the fitting property of the long side sidewalls 32*c* due to the deformation of them.

More specifically, in the electronic component unit 1 described above, the housing 3 includes the base cover 31 to which the insert bus bar plate 2 is assembled, and the top cover 32 that covers the insert bus bar plate 2 assembled to the base cover 31 from the side opposite the base cover 31. The insert bus bar plate 2 is assembled to the inside, which is defined by the base cover 31 and the top cover 32, of the housing 3. The opposed surfaces 35 on which the protrusions 34 are disposed are the inner wall surfaces of the top cover 32. The protrusions 34 include the multiple protruded ribs 32*g*. The protruded ribs 32*g* are formed on the inner wall surfaces, which include the opposed surfaces 35, of the top cover 32. The protruded ribs 32*g* face the edge surfaces of the insert bus bar plate 2, protrude from the inner wall surfaces, which include the opposed surfaces 35, of the top cover 32 toward the edge surfaces of the insert bus bar plate 2, and are each located between the adjacent exposed ends 24*d* in the arrangement direction of the multiple exposed ends 24*d*, in a state where the insert bus bar plate 2 is assembled inside the housing 3. As a result, in the electronic component unit 1, the protruded ribs 32*g* that are included in the protrusions 34 and are each interposed between the adjacent exposed ends 24*d* can prevent the exposed ends 24*d* from coming into contact with the inner wall surfaces of the top cover 32 when the top cover 32 is attached so as to cover the insert bus bar plate 2 assembled to the base cover 31 included in the housing 3.

As illustrated in FIG. 11, for example, each protruded rib 32*g* is located between the adjacent exposed ends 24*d* in the arrangement direction of the multiple exposed ends 24*d*, in a state where the insert bus bar plate 2 is assembled inside the housing 3. As a result, the electronic component unit 1 can insulate the adjacent exposed ends 24*d* with the protruded rib 32*g*. The electronic component unit 1 can basically insulate the exposed ends 24*d* by air insulation. The structure including the protruded ribs 32g made from a resin can further enhance the insulation between the exposed ends 24d. This structure also makes it possible for the electronic component unit 1 to readily maintain the insulation between the exposed ends 24d even when water enters or dew condenses on the inner wall surfaces of the top cover 32, for example.

In the electronic component unit 1, the protruded ribs 32g (the protrusions 34) extend along the direction in which the base cover 31, the insert bus bar plate 2, and the top cover 32 are stacked. As a result, the electronic component unit 1 can prevent the exposed ends 24d from coming into contact with the inner wall surfaces of the top cover 32 in the whole process of attaching the top cover 32 to cover the insert bus bar plate 2 assembled to the base cover 31, thereby making it possible to more reliably enhance the assembling property.

In the electronic component unit 1 described above, the protruding amount T1 of the protruded rib 32g (the protrusion 34) from the inner wall surface (the opposed surface 35) of the top cover 32 toward the edge surface side of the insert bus bar plate 2 is larger than the clearance D1 between the exposed end 24d and the inner wall surface (the opposed surface 35) of the top cover 32. As illustrated in FIG. 11, for example, the protruded rib 32g overlaps with the exposed ends 24d in the direction to the protruding direction (the short side direction) of the exposed ends 24d, in a state where the base cover 31, the insert bus bar plate 2, and the top cover 32 are assembled. As a result, the electronic component unit 1 can reliably prevent the exposed ends 24d from coming into contact with the inner wall surfaces of the top cover 32 and reliably insulate the adjacent exposed ends 24d.

In the electronic component unit 1, the insert bus bar plate 2 has the multiple exposed ends 24d on each of the paired opposite edge surfaces, in this case, each of the edge surfaces of the paired long sides. At least one protruded rib 32g (the protrusion 34) is disposed on each of the inner wall surfaces (the opposed surfaces 35), which face the paired opposite edge surfaces, of the top cover 32. As a result, the electronic component unit 1 can reliably prevent the exposed ends 24d on both edge surface sides from coming into contact with the inner wall surfaces of the top cover 32 even when a worker attaches the top cover 32 to the base cover 31 while gripping the top cover 32 and the top cover 32 is bent toward the protruding direction of the exposed ends 24d (the short side direction), for example.

In the electronic component unit 1, the insert bus bar plate 2 has the guide portions 28, which guide the top ends of the protruded ribs 32g (the protrusions 34) outside the edge surfaces of the insert bus bar plate 2, on the surface thereof facing the top cover 32, in a state where the insert bus bar plate 2 is assembled inside the housing 3. As illustrated in FIGS. 12 and 13, for example, in the electronic component unit 1, when the top cover 32 is attached so as to cover the insert bus bar plate 2 assembled to the base cover 31, the top ends of the protruded ribs 32g abut the guide portions 28 and thereafter the top ends of the protruded ribs 32g can be guided by the guide portions 28 outside the edge surfaces of the insert bus bar plate 2. As a result, the electronic component unit 1 can prevent the top ends of the protruded ribs 32g from being put on the substrate main body 21 of the insert bus bar plate 2, for example. The electronic component unit 1 can properly position the top cover 32, and thus the protruded ribs 32g, thereby making it possible to prevent the interference between the inner wall surfaces of the top cover 32 and the exposed ends 24d. As a result, the fitting property can be enhanced. The electronic component unit 1 can further enhance the workability when the insert bus bar plate 2 is assembled to the housing 3, thereby making it possible to further enhance the assembling property.

In the electronic component unit 1, the guide portions 28 have the tapered surfaces 28a tilted toward outside the edge surfaces of the insert bus bar plate 2. The electronic component unit 1, thus, can simply achieve the structure that guides the top ends of the protruded ribs 32g outside the edge surfaces of the insert bus bar plate 2.

Second Embodiment

Figure 14:
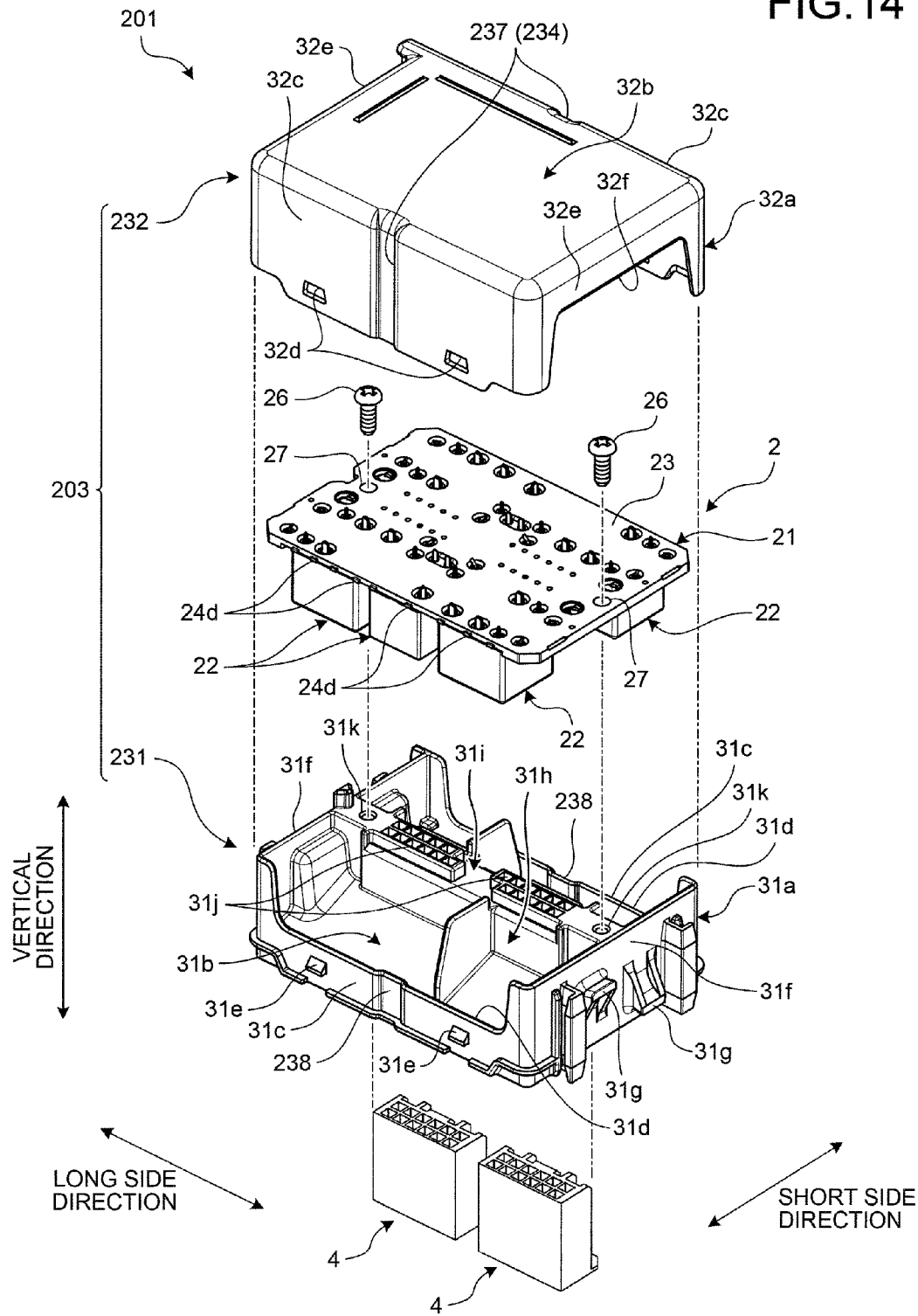
FIG. 14 is an exploded perspective view illustrating a schematic structure of an electronic component unit according to a second embodiment.
Figure 15:
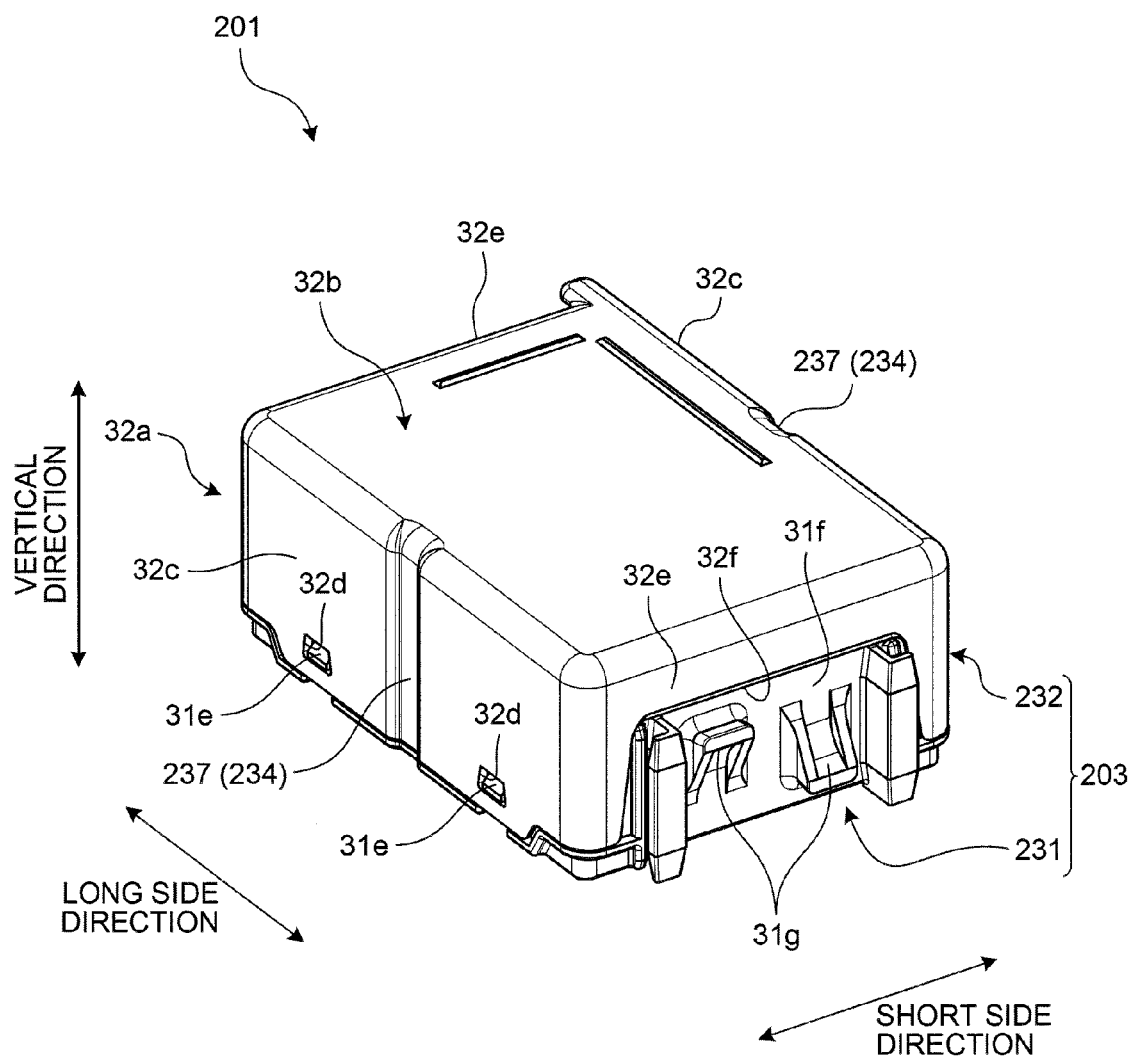
FIG. 15 is a perspective view illustrating the schematic structure of the electronic component unit according to the second embodiment.
Figure 16:
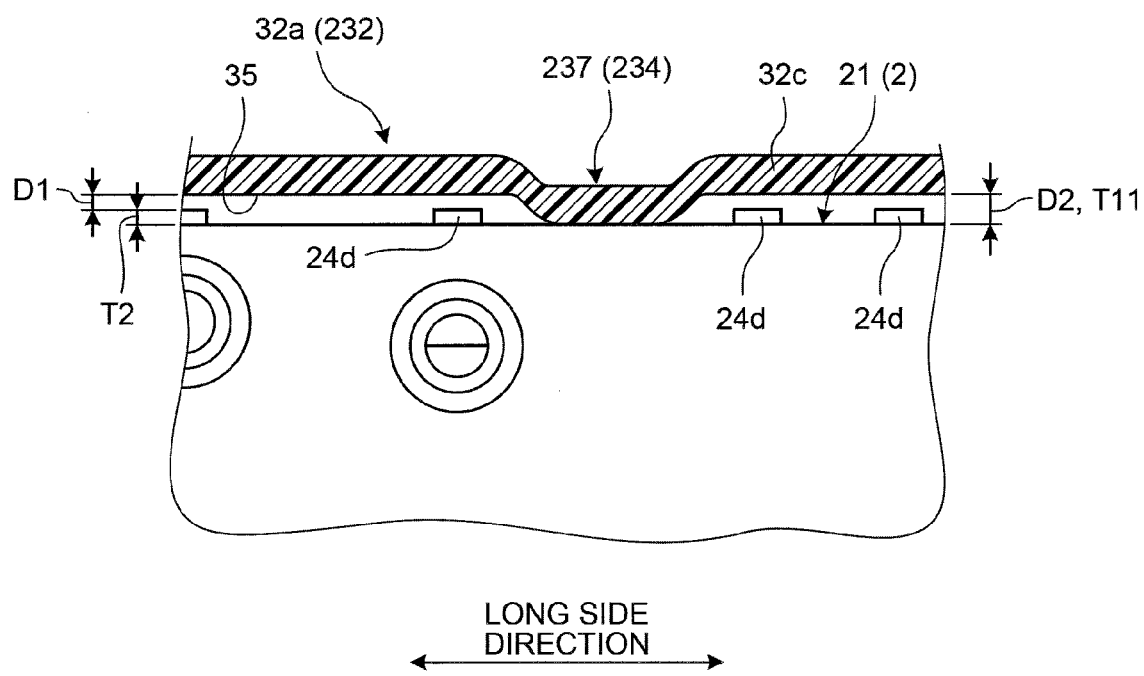
FIG. 16 is a schematic partial cross-sectional view including a projecting wall portion of the electronic component unit according to the second embodiment.

FIG. 14 is an exploded perspective view illustrating a schematic structure of an electronic component unit according to a second embodiment. FIG. 15 is a perspective view illustrating the schematic structure of the electronic component unit according to the second embodiment. FIG. 16 is a schematic partial cross-sectional view including a projecting wall portion of the electronic component unit according to the second embodiment. The electronic component unit and the wire harness according to the second embodiment differ in the structure of the protrusions from that in the first embodiment. The descriptions of the structure, operation, and effect in common with those of the first embodiment are omitted as far as possible.

As illustrated in FIGS. 14, 15, and 16, an electronic component unit 201 according to the second embodiment includes the insert bus bar plate 2 serving as a plate, a housing 203 serving as a supporting member, the connectors 4 serving as connecting parts of the electric wires. The insert bus bar plate 2 is assembled inside the housing 203. The housing 203 includes a base cover 231 serving as a base, a top cover 232 serving as a lid, and the connector fitting parts 33 (e.g., refer to FIG. 6) serving as the connecting portion-fitting part. The insert bus bar plate 2 is assembled to the inside, which is defined by the base cover 231 and the top cover 232, of the housing 203. In the electronic component unit 1, protrusions 234 are formed on the housing 203, thereby enhancing the assembling property of the insert bus bar plate 2 to the housing 203. The housing 203 in the second embodiment has approximately the same structure as the housing 3 in the first embodiment although the shape differs to some extent from that of the housing 3, in addition to the portions relating to the protrusions 234.

The protrusions 234 in the second embodiment are formed on the opposed surfaces 35 (refer to FIG. 16) of the housing 203. The protrusion 234 is formed on each of the opposed surfaces 35 such that the protrusion 234 faces the edge surface of the insert bus bar plate 2, protrudes from the opposed surface 35 toward the edge surface side of the insert bus bar plate 2, and is located between the adjacent exposed ends 24d in the arrangement direction of the multiple exposed ends 24d. The opposed surfaces 35 in the second embodiment are the inner wall surfaces of the top cover 232, more specifically, are the inner wall surfaces of the long side sidewalls 32c serving as the wall bodies. The opposed surfaces 35 in the second embodiment include projecting wall portions 237 formed such that the long side sidewalls 32c are depressed.

The projecting wall portions 237 face the edge surfaces of the insert bus bar plate 2 and each of the projecting wall portions 237 is located between the adjacent exposed ends 24d in the arrangement direction of the multiple exposed ends 24d, in a state where the insert bus bar plate 2 is assembled inside the housing 203. The projecting wall portions 237 are formed such that the long side sidewalls 32c that are wall bodies including the opposed surfaces 35 are depressed toward the edge surfaces side of the insert bus bar plate 2. The projecting wall portions 237 are formed at the locations that face the edge surfaces of the insert bus bar plate 2, specifically the edge surfaces on which the exposed ends 24d are formed along the long side direction, in a state where the insert bus bar plate 2 is assembled inside the housing 203. The projecting wall portions 237 are formed such that certain portions of the long side sidewalls 32c of the top cover 232 are depressed to project from the opposed surfaces 35 toward the edge surfaces side of the insert bus bar plate 2. In other words, the top cover 232 is formed, at the portions where the projecting wall portions 237 of the long side sidewalls 32c serving as the wall bodies are formed, such that the outer surface thereof (the surface opposite the housing space 31h) is recessed and the inner surface thereof (the surface on the housing space 31h side) is projected. The projecting wall portions 237 (the protrusions 234) extend along the direction in which the base cover 231, the insert bus bar plate 2, and the top cover 232 are stacked. The projecting wall portions 237 are formed on the long side sidewalls 32c of the rectangular frame part 32a of the top cover 232 such that they extend from the ceiling 32b to the top ends of the long side sidewalls 32c in a direction toward the base cover 231 and the insert bus bar plate 2 when the top cover 232 is assembled to the base cover 231.

The multiple exposed ends 24d are exposed on each of the edge surfaces of the paired long sides of the insert bus bar plate 2. The edge surfaces serve as the paired opposite edge surfaces. At least one projecting wall portion 237 (the protrusion 234) is disposed on each of the opposed surfaces 35 that face the paired opposite edge surfaces. In other words, at least one projecting wall portion 237 is disposed on each of the paired long side sidewalls 32c of the top cover 232. The projecting wall portions 237 may be each formed between the adjacent exposed ends 24d of all of the exposed ends 24d. In the second embodiment, the projecting wall portions 237 are each formed between the adjacent exposed ends 24d the distance between which is relatively large at the central area in the long side direction, i.e., two projecting wall portions 237 are formed in total.

As illustrated in FIG. 16, for example, a protruding amount T11 of each projecting wall portion 237 (the protrusion 234) is larger than the clearance D1 between the exposed end 24d and the inner wall surface (the opposed surface 35) of the long side sidewall 32c (T11>D1). The protruding amount T11 of the projecting wall portion 237 is the protruding amount of the projecting wall portion 237 from the inner wall surface of the long side sidewall 3c, which includes the opposed surface 35, toward the edge surface side of the insert bus bar plate 2. The protruding amount T11 of the projecting wall portion 237 is substantially equal to the clearance (typically, a minimum clearance when tolerances are taken into account) D2 between the inner wall surface of the long side sidewall 32c of the top cover 232 and the edge surface on which the exposed ends 24d are formed of the insert bus bar plate 2. Each projecting wall portion 237 (protrusion 234) is preferably formed such that the top end thereof in the protruding direction (the short side direction) abuts the edge surface (on which the exposed ends 24d are formed) of the insert bus bar plate 2.

The base cover 231 in the second embodiment further has fitting recessed portions 238. The fitting recessed portions 238 are recesses to which the projecting wall portions 237 included in the protrusions 234 can be fitted. The fitting recessed portions 238 are formed at the locations facing the projecting wall portions 237 and each of which is formed in the opposite shape of the shape of the projecting wall portion 237, in a state where the top cover 232 is assembled to the base cover 231. The fitting recessed portions 238 are formed such that the portions, which face the projecting wall portions 237, in a state where the top cover 232 is assembled to the base cover 231, of the long side sidewalls 31c serving as the wall bodies are depressed toward the insert bus bar plate 2. The fitting recessed portions 238 are formed such that the certain portions of the long side sidewalls 31c of the base cover 231 are depressed so as to project toward the insert bus bar plate 2 side. In other words, the top cover 232 is formed, at the portions where the fitting recessed portions 238 of the long side sidewalls 31c serving as the wall bodies are formed, such that the outer surface thereof (the surface opposite the housing space 31h) is recessed and the inner surface thereof (the surface on the housing space 31h side) is projected. The fitting recessed portions 238 extend along the direction in which the base cover 231, the insert bus bar plate 2, and the top cover 232 are stacked. The fitting recessed portions 238 are formed on the long side sidewalls 31c of the rectangular frame part 31a of the base cover 231 such that they extend from the bottom 31b to the top ends of the long side sidewalls 31c in a direction toward the top cover 232 and the insert bus bar plate 2. The fitting recessed portion 238 is disposed on each of the paired long side sidewalls 31c of the base cover 231. The fitting recessed portion 238 is disposed at the central area in the long side direction on each of the paired long side sidewalls 31c of the base cover 231, i.e., two fitting recessed portions 238 are disposed in total.

The wire harness 150 including the electronic component unit 201 has such a structure that the protrusions 234 formed on the housing 203 to which the insert bus bar plate 2 is assembled are each located between the adjacent exposed ends 24d in the arrangement direction of the multiple exposed ends 24d of the bus bars 24. As a result, in the electronic component unit 201, the protrusions 234 each interposed between the adjacent exposed ends 24d can prevent the exposed ends 24d from coming into contact with the housing 203 when the insert bus bar plate 2 is assembled to the housing 203, for example. The electronic component unit 201 can prevent the exposed ends 24d from scratching the housing 203 when the insert bus bar plate 2 is assembled to the housing 203, for example, thereby making it possible to enhance the workability of the assembly. As a result, the assembling property of the insert bus bar plate 2 to the housing 203 can be enhanced. In the electronic component unit 201, the protrusions 234 formed on the opposed surfaces 35 of the housing 203 can increase the stiffness of the long side sidewalls 32c of the housing 203, thereby making it possible to prevent the long side sidewalls 32c from being tilted (inward tilt) and the deterioration of the fitting property of the long side sidewalls 32c due to the deformation and the like of them.

In the electronic component unit 201, the protrusions 234 face the edge surfaces of the insert bus bar plate 2 and are each located between the adjacent exposed ends 24d in the arrangement direction of the multiple exposed ends 24d, in a state where the insert bus bar plate 2 is assembled to the housing 203. The protrusions 234 include the projecting wall portions 237 formed such that the long side sidewalls 32c, which serve as the wall bodies and include the opposed surfaces 35, are depressed toward the edge surfaces side of the insert bus bar plate 2. As a result, in the electronic component unit 201, the projecting wall portions 237, which are included in the protrusions 234 and each interposed between the adjacent exposed ends 24d, can prevent the exposed ends 24d from coming into contact with the inner wall surfaces of the top cover 232 when the top cover 232 is attached so as to cover the insert bus bar plate 2 assembled to the base cover 231 included in the housing 203. The projecting wall portions 237 included in the protrusions 234 in the second embodiment can be structured such that the protrusions 234 protrude from the opposed surfaces 35 toward the edge surfaces of the insert bus bar plate 2 with a thickness substantially equal to the thickness of the long side sidewall 32c, which serves as the wall body and includes the opposed surface 35, unlike the protruded ribs 32g described above. As a result, the electronic component unit 201 can prevent a sink (a depressed or recessed portion caused by molding shrinkage) or a warpage from occurring in the top cover 232, in which the protrusions 234 (the projecting wall portions 237) are formed, of the housing 203.

In the electronic component unit 201, the base cover 231 has the fitting recessed portions 238 to which the projecting wall portions 237 included in the protrusions 234 can be fitted. In the electronic component unit 201, the projecting wall portions 237 included in the protrusions 234 are fitted to the fitting recessed portions 238, in a state where the rectangular frame part 32a including the long side sidewalls 32c is disposed outside so as to overlap the rectangular frame part 31a including the long side sidewalls 31c. The electronic component unit 201, thus, can readily position the top cover 232 to the base cover 231 using the projecting wall portions 237 included in the protrusions 234. In the electronic component unit 201, the fitting recessed portions 238 can also increase the stiffness of the long side sidewalls 31c of the housing 203, thereby making it possible to further prevent the long side sidewalls 31c from being tilted (inward tilt) and the deterioration of the fitting property of the long side sidewalls 31c due to the deformation and the like of them.

In the electronic component unit 201 described above, the top ends of the projecting wall portions 237 in the protruding direction included in the protrusions 234 abut the edge surfaces of the insert bus bar plate 2 between the adjacent exposed ends 24d. The electronic component unit 201, thus, can readily guide the projecting wall portions 237 included in the protrusions 234 between the adjacent exposed ends 24d. As a result, the electronic component unit 201 can further enhance the assembling property of the insert bus bar plate 2 to the housing 203 and further prevent the long side sidewalls 32c from being tilted (inward tilt) and the deterioration of the fitting property of the long side sidewalls 32c due to the deformation and the like of them.

The electronic component units and the wire harness according to the embodiments described above are not limited to those described above, and can be changed in various ways within the scopes of the claims.

The electronic component units 1 and 201 are described above as the electronic component modules assembled to the electrical connection box 100 in a detachable manner. The structures of the electronic component units 1 and 201 are not limited to being assembled to the electrical connection box 100. For example, the structures of the electronic component units 1 and 201 may be applied to the electrical connection box 100 itself.

The electronic component 22 described above is the relay. The electronic component 22 is not limited to the relay, and may be a fuse, for example.

In the above explanation, the protruded ribs 32g, which are 16 in total, are each located between the adjacent exposed ends 24d the distance between which is a relatively small. The arrangement of the protruded ribs 32g is not limited to this example. At least one protruded rib 32g is preferably disposed on each of the inner wall surfaces of the top cover 32, which inner wall surfaces face the corresponding paired edge surfaces on which the exposed ends 24d are formed. In this case, the protruded rib 32g is more preferably disposed at the center in the arrangement direction of the exposed ends 24d because the center tends to be readily bent in the assembling work.

In the electronic component unit 1 in the first embodiment, the protruded ribs 32g each have the tapered surface 32h formed on the top end side thereof. The structure is not limited to this example.

In the first embodiment, the housing 3 serves as the supporting member and includes the base cover 31 serving as the base and the top cover 32 serving as the lid. The insert bus bar plate 2 is assembled inside the housing 3. In the second embodiment, the housing 203 serves as the supporting member and includes the base cover 231 serving as the base and the top cover 232 serving as the lid. The insert bus bar plate 2 is assembled inside the housing 203. The structure is not limited to those in the first and the second embodiments. The insert bus bar plate 2 may be assembled to the top cover 32 or the top cover 232, which may serve as the supporting member. The base cover 31 and the top cover 32, or the base cover 231 and the top cover 232 are not necessarily separated members. For example, the supporting member may be structured by a part of the box main body 101 included in the electrical connection box 100. The protrusions 34 or the protrusions 234 may be disposed on the supporting member thus structured.

The guide portion 28 described in the first embodiment and the similar structure thereof may be applied to the electronic component unit and the wire harness described in the second embodiment. The fitting recessed portions 238 described in the second embodiment and the similar structure thereof may be applied to the electronic component unit and the wire harness described in the first embodiment.

In the electronic component unit and the wire harness according to the present invention, the protrusions formed on the supporting member to which the plate is assembled are each located between the adjacent exposed ends in the arrangement direction of the multiple exposed ends of the bus bars. As a result, in the electronic component unit and the wire harness, the protrusions each interposed between the adjacent exposed ends can prevent the exposed ends from coming into contact with the supporting member when the plate is assembled to the supporting member, for example. The electronic component unit and the wire harness, thus, prevent the exposed ends from scratching the supporting member when the plate is assembled to the supporting member, for example, thereby making it possible to enhance the workability of the assembly. As a result, the electronic component unit and the wire harness have an advantageous effect of capable of enhancing the assembling property of the plate to the supporting member.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic component unit comprising:
a plate made of a resin material configured to embed a metallic bus bar in the resin material and mount an electronic component thereon; and
a supporting member to which the plate is assembled, wherein the plate has a plurality of exposed ends at which the bus bar is partially exposed on an edge surface of the plate, and the supporting member includes a protrusion that is formed on an opposed surface of the supporting member facing the edge surface of the plate such that the protrusion faces the edge surface of the plate, protrudes from the opposed surface toward the edge surface side of the plate, and is located between the adjacent exposed ends in an arrangement direction of the plurality of exposed ends, wherein the plate has a width, a length, and a height, the height being shorter than each of the length and the width, wherein the edge surface of the plate is defined by the height and one of the width and the length, and wherein a main surface of the plate, which is configured to mount the electronic component therein, is defined by the length and the width.

2. The electronic component unit according to claim 1, wherein
the protrusion includes a protruded rib that is formed on the opposed surface such that the protruded rib faces the edge surface of the plate, protrudes from the opposed surface toward the edge surface side of the plate, and is located between the adjacent exposed ends in the arrangement direction of the plurality of exposed ends, in a state where the plate is assembled to the supporting member.

3. The electronic component unit according to claim 2, wherein
the protrusion includes a projecting wall portion that is formed such that a wall body including the opposed surface is depressed toward the edge surface side of the plate, faces the edge surface of the plate, and is located between the adjacent exposed ends in the arrangement direction of the plurality of exposed ends, in a state where the plate is assembled to the supporting member.

4. The electronic component unit according to claim 3, wherein
a protruding amount of the protrusion from the opposed surface toward the edge surface side of the plate is larger than a clearance between the exposed ends and the opposed surface.

5. The electronic component unit according to claim 2, wherein
the supporting member includes a base to which the plate is assembled and a lid that covers the plate assembled to the base from the side opposite the base, and the plate is assembled to an inside of the supporting member, the inside being defined by the base and the lid, and
the protrusion extends along a direction in which the base, the plate, and the lid are stacked.

6. The electronic component unit according to claim 2, wherein
a protruding amount of the protrusion from the opposed surface toward the edge surface side of the plate is larger than a clearance between the exposed ends and the opposed surface.

7. The electronic component unit according to claim 2, wherein
the plate has the plurality of exposed ends on each of paired opposite edge surfaces,
the protrusion comprises one or more protrusions, and
at least one protrusion of the one or more protrusions is disposed on each opposed surface of the supporting member facing the corresponding paired opposite edge surfaces.

8. The electronic component unit according to claim 1, wherein
the protrusion includes a projecting wall portion that is formed such that a wall body including the opposed surface is depressed toward the edge surface side of the plate, faces the edge surface of the plate, and is located between the adjacent exposed ends in the arrangement direction of the plurality of exposed ends, in a state where the plate is assembled to the supporting member.

9. The electronic component unit according to claim 8, wherein
the supporting member includes a base to which the plate is assembled and a lid that covers the plate assembled to the base from the side opposite the base, and the plate is assembled to an inside of the supporting member, the inside being defined by the base and the lid, and
the protrusion extends along a direction in which the base, the plate, and the lid are stacked.

10. The electronic component unit according to claim 9, wherein
the opposed surface is an inner wall surface of the lid, and
the base includes a fitting recessed portion to which the protrusion is capable of being fitted.

11. The electronic component unit according to claim 10, wherein
the guide portion has a tapered surface that is tilted toward outside of the edge surface of the plate.

12. The electronic component unit according to claim 8, wherein
a protruding amount of the protrusion from the opposed surface toward the edge surface side of the plate is larger than a clearance between the exposed ends and the opposed surface.

13. The electronic component unit according to claim 8, wherein
the plate has the plurality of exposed ends on each of paired opposite edge surfaces,
the protrusion comprises one or more protrusions, and
at least one protrusion of the one or more protrusions is disposed on each opposed surface of the supporting member facing the corresponding paired opposite edge surfaces.

14. The electronic component unit according to claim 1, wherein
the supporting member includes a base to which the plate is assembled and a lid that covers the plate assembled to the base from the side opposite the base, and the plate is assembled to an inside of the supporting member, the inside being defined by the base and the lid, and
the protrusion extends along a direction in which the base, the plate, and the lid are stacked.

15. The electronic component unit according to claim 14, wherein
a protruding amount of the protrusion from the opposed surface toward the edge surface side of the plate is larger than a clearance between the exposed ends and the opposed surface.

16. The electronic component unit according to claim 1, wherein
a protruding amount of the protrusion from the opposed surface toward the edge surface side of the plate is larger than a clearance between the exposed ends and the opposed surface.

17. The electronic component unit according to claim 1, wherein
the plate has the plurality of exposed ends on each of paired opposite edge surfaces,
the protrusion comprises one or more protrusions, and
at least one protrusion of the one or more protrusions is disposed on each opposed surface of the supporting member facing the corresponding paired opposite edge surfaces.

18. The electronic component unit according to claim 1, wherein
the supporting member includes a base to which the plate is assembled and a lid that covers the plate assembled to the base from the side opposite the base, and the plate is assembled to an inside of the supporting member, the inside being defined by the base and the lid,
the opposed surface is an inner wall surface of the lid, and
the plate includes a guide portion that is formed on a surface facing the lid, and guides a top end of the protrusion outside the edge surface of the plate, in a state where the plate is assembled to the inside of the supporting member.

19. The electronic component unit according to claim 1, wherein
a top end of the protrusion in a protruding direction abuts the edge surface of the plate.

20. A wire harness comprising:
an electric wire; and
an electronic component unit electrically connected to the electric wire, wherein
the electronic component unit includes
a plate made of a resin material configured to embed a metallic bus bar in the resin material and mount an electronic component thereon, and
a supporting member to which the plate is assembled,
the plate has a plurality of exposed ends at which the bus bar is partially exposed on an edge surface of the plate, and
the supporting member includes a protrusion that is formed on an opposed surface of the supporting member facing the edge surface of the plate such that the protrusion faces the edge surface of the plate, protrudes from the opposed surface toward the edge surface side of the plate, and is located between the adjacent exposed ends in an arrangement direction of the plurality of exposed ends,
wherein the plate has a width, a length, and a height, the height being shorter than each of the length and the width,
wherein the edge surface of the plate is defined by the height and one of the width and the length, and
wherein a main surface of the plate, which is configured to mount the electronic component therein, is defined by the length and the width.

* * * * *